United States Patent
Bae et al.

(10) Patent No.: US 8,866,278 B1
(45) Date of Patent: Oct. 21, 2014

(54) SEMICONDUCTOR DEVICE WITH INCREASED I/O CONFIGURATION

(75) Inventors: Jae Min Bae, Seoul (KR); Byong Jin Kim, Buchen-si (KR); Hyng Il Jeon, Namyangju-si (KR); Yoon Ki Namkung, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 173 days.

(21) Appl. No.: 13/270,000

(22) Filed: Oct. 10, 2011

(51) Int. Cl.
*H01L 23/495* (2006.01)

(52) U.S. Cl.
USPC .......................................... 257/676; 257/784

(58) Field of Classification Search
CPC ................. H01L 2924/00; H01L 2224/48247; H01L 2924/00014; H01L 2224/73265; H01L 2224/32245; H01L 2224/49171; H01L 2224/48257; H01L 23/49541
USPC .................................................. 257/676, 784
See application file for complete search history.

(56) References Cited

U.S. PATENT DOCUMENTS

| | | | | |
|---|---|---|---|---|
| 7,808,084 B1 * | 10/2010 | Lee et al. | ............... | 257/666 |
| 2004/0080025 A1 * | 4/2004 | Kasahara et al. | ............... | 257/666 |
| 2009/0236704 A1 * | 9/2009 | Camacho et al. | ............... | 257/670 |
| 2011/0115061 A1 * | 5/2011 | Krishnan et al. | ............... | 257/676 |

FOREIGN PATENT DOCUMENTS

| | | |
|---|---|---|
| DE | 19734794 A1 | 8/1997 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | EP1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Duy T Nguyen
(74) *Attorney, Agent, or Firm* — Kevin B. Jackson

(57) ABSTRACT

In accordance with the present invention, there is provided a semiconductor package or device including a uniquely configured leadframe sized and configured to maximize the available number of exposed lands or I/O's in the semiconductor device. More particularly, the semiconductor device of the present invention includes a die pad (or die paddle) defining multiple peripheral edge segments. In addition, the semiconductor device includes a plurality of lands which are provided in a prescribed arrangement. Connected to the top surface of the die pad is at least one semiconductor die which is electrically connected to at least some of the lands. At least portions of the die pad, the lands, and the semiconductor die are encapsulated by the package body, with at least portions of the bottom surfaces of the die pad and the lands being exposed in a common exterior surface of the package body.

20 Claims, 19 Drawing Sheets

(56) References Cited

FOREIGN PATENT DOCUMENTS

| | | |
|---|---|---|
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.cominews/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE WITH INCREASED I/O CONFIGURATION

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an enhanced capacity semiconductor device or package which includes an increased number of lands serving as I/O's, the lands being provided in a prescribed arrangement and exposed within a common exterior surface of the package body of the device.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body or may be partially exposed therein for use in electrically connecting the package to another component. In certain semiconductor packages, a portion of the die pad of the leadframe also remains exposed within the package body.

Leadframes for semiconductor devices or packages can be largely classified into copper-based leadframes (copper/iron/phosphorous: 99.8/0.01/0.025), copper alloy-based leadframes (copper/chromium/tin/zinc: 99.0/0.25/0.22), and alloy 42-based leadframes (iron/nickel; 58.0/42.0) according to the composition of the elements or materials included in the leadframe. Exemplary semiconductor devices employing leadframes include a through-hole mounting dual type inline package (DIP), a surface mounting type quad flat package (QFP), and a small outline package (SOP). In recent years, land grid array type semiconductor devices using leadframes have also been developed for use in certain applications.

The aforementioned semiconductor devices are particularly advantageous for their smaller size and superior electrical performance. In the electronics industry and, in particular, in high frequency applications such hard disk drives, digital television and other consumer electronics, there is an increasing need for exposed pad or land semiconductor devices of increased functional capacity, coupled with reduced size and weight. In view of this need, conventional leadframe structures as currently known and integrated into existing semiconductor devices often prove to be unsatisfactory. The present invention provides a semiconductor device which addresses the aforementioned needs by providing increased I/O with a reduced overall size. The semiconductor device of the present invention includes a leadframe having an increased number of lands which are provided in a prescribed arrangement and exposed within a common exterior surface of the package body of the device. The leadframe of the semiconductor device may be fabricated in accordance with standard, low-cost forming techniques, with sawing, punching, etching, or other material removal processes being completed during the fabrication of the semiconductor device to effectively electrically isolate various structural features from each other therein. These, as well as other features and attributes of the present invention will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
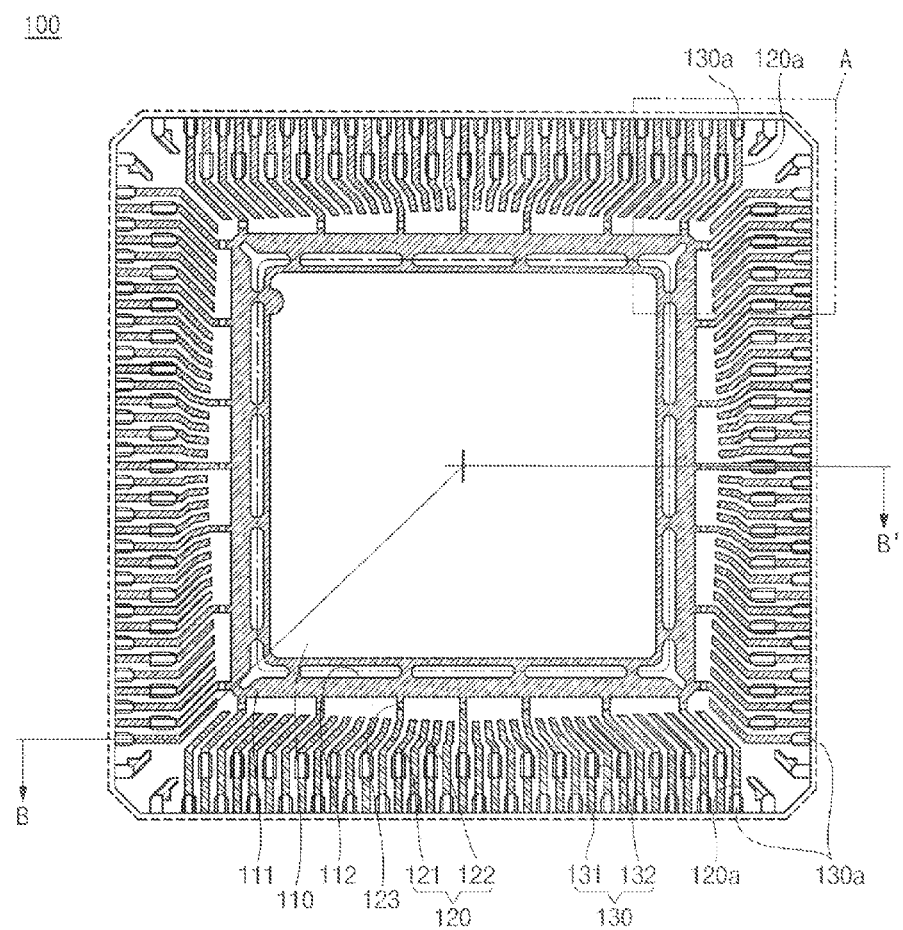
FIG. 1 is a top plan view of an unsingulated leadframe which is integrated into a semiconductor device or package constructed in accordance with a first embodiment of the present invention.

Referring now to the drawings wherein the showings are for purposes of illustrating preferred embodiments of the present invention only, and not for purposes of limiting the same, FIGS. 9-12 depict a semiconductor package or device 1100 constructed in accordance with a first embodiment of the present invention. The leadframe 100 integrated into the semiconductor package 1100 is shown in its unsingulated state in FIGS. 1-4.

Figure 2:
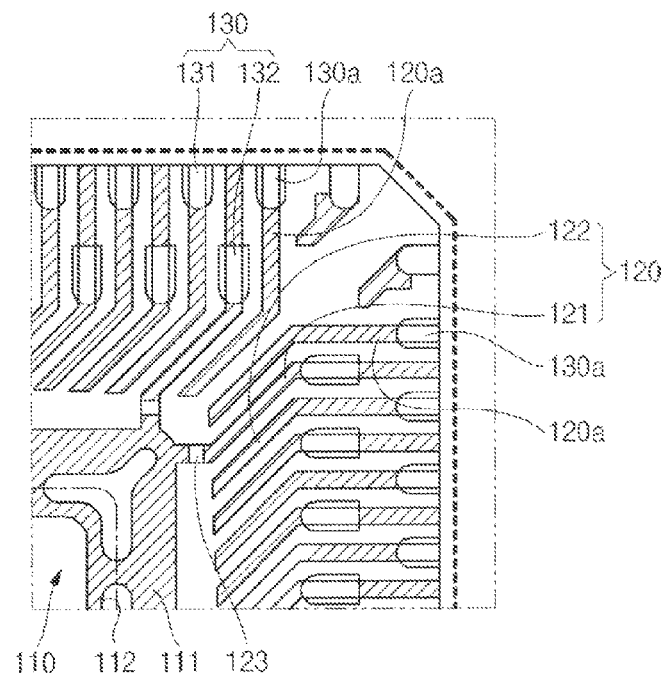
FIG. 2 is an enlargement of the region A of FIG. 1.

Referring now to FIGS. 1-4, the leadframe 100 comprises a generally quadrangular (e.g., square) die paddle or die pad 110 which defines four peripheral edge segments and four corner regions. The peripheral edge segments of the die pad 110 are defined by a peripheral region thereof. Additionally, when viewed from the perspective shown in FIGS. 3 and 4, the die pad 110 defines opposed, generally planar top and bottom surfaces. As is further most easily seen in FIGS. 3 and 4, the die pad 110 of the leadframe 100 is not of uniform thickness. Rather, a peripheral portion of the bottom surface of the die pad 110 is partially etched (e.g., half-etched) to define an etched surface 111. More particularly, the etched surface 111, which is recessed relative to the remainder of the bottom surface of the die pad 110, extends about the entire periphery of the die pad 100, and thus along each of the peripheral edge segments defined thereby. In FIGS. 1 and 2, the etched surface 111 in the bottom surface of the die pad 110 is indicated by the condensed hatching which slopes downwardly from right to left. The die pad 110 further includes a plurality of elongated holes or slots 112 which are disposed in the peripheral portion thereof, and extend between the top surface and the etched surface 111. As seen in FIG. 1, the slots 112 are generally aligned with each other in end-to-end fashion, and arranged in a generally quadrangular pattern so as to extend along and in relative close proximity to the peripheral edge segments of the die pad 110. The use of the slots 112 will be discussed in more detail below.

As will be also discussed in more detail below, in the fabrication process for the semiconductor device 1100 including the leadframe 100, a semiconductor die is attached to the top surface of the die pad 110 through the use of an adhesive layer, with an encapsulant material thereafter being applied to the semiconductor die and the leadframe 100 to form the package body of the semiconductor device 1100. Advantageously, the etched surface 111 formed in the peripheral portion of the bottom surface of the die pad 110 as indicated above effectively increases the distance along which moisture must travel to reach the semiconductor die mounted to the top surface of the die pad 110. As a result, such semiconductor die is safely protected against moisture in the completed semiconductor device 1100. Additionally, the flow of encapsulant material over the etched surface 111 during the formation of the package body of the semiconductor device 1100 facilitates the creation of a mechanical interlock between the package body and the die pad 110. Further, the inclusion of the slots 112 in the die pad 110 prevents any undesirable flow of the adhesive layer used to secure the semiconductor die to the top surface of the die pad 110 to and over the peripheral edge segments thereof.

The leadframe 100 of the semiconductor device 1100 further comprises a plurality of connect bars 120 and a plurality of lands 130. The connect bars 120 are segregated into first connect bars 121, second connect bars 122 and corner connect bars 120a. Similarly, the lands are segregated into first lands 131, second lands 132 and corner lands 130a.

As best seen in FIGS. 1 and 2, the first connect bars 121 are integrally connected to extend between the die pad 110 and a generally quadrangular outer frame or dambar (not shown) of the unsingulated leadframe 100 which circumvents the die pad 110. As further seen in FIG. 1, the first connect bars 121 are segregated into four (4) sets of seven (7) each, with the first connect bars 121 of each set extending between one of the peripheral edge segments of the die pad 110 and a corresponding one of the four peripheral edge segments of the surrounding outer frame or dambar. Of the first connect bars 121 of each set, the central or middle first connect bar 121 has a straight, generally linear configuration, with the remaining first connect bars 121 of the same set each having a non-linear configuration. Those of ordinary skill in the art will recognize that the inclusion of seven first connect bars 121 in each set thereof is exemplary only, and that fewer or greater first connect bars 121 may be included in each such set without the departing from the spirit and scope of the present invention.

Figure 3:
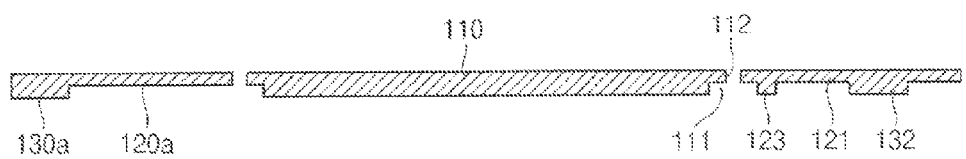
FIG. 3 is a cross-sectional view of the leadframe taken along line B-B' of FIG. 1.

As seen in FIGS. 1-3, the first connect bars 121 are not of uniform thickness. Rather, as is most easily seen from the perspective shown in FIGS. 3 and 4, portions of the bottom surface of each of the first connect bars 121 are subjected to a partial etching process (e.g., are half-etched) that results in each of the first connect bars 121 having two (2) regions which are of increased thickness in comparison to the remainder thereof. One of these increased thickness regions of the middle first connect bar 121 and the outermost pair of the first connect bars 121 of each set defines a second land 132 thereof. Similarly, one of these increased thickness regions of each of the remaining first connect bars 121 of the same set defines a first land 131 thereof. As seen in FIG. 1, the second lands 132 of the first connect bars 121 of each set are disposed closer to the die pad 110 than the first lands 131 of the remaining first connect bars 121 of the same set. The increased thickness region of each of the first connect bars 121 which does not define the first land 131 or second land 132 thereof defines a connector 123 of such first connect bar 121.

Figure 4:
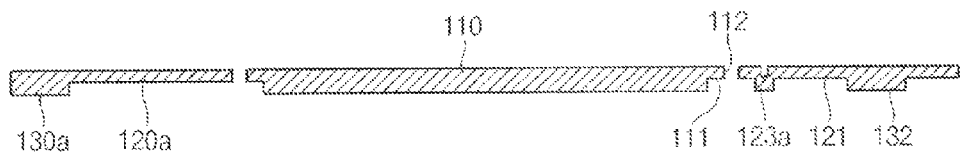
FIG. 4 is a cross-sectional view identical to FIG. 3 but depicting the leadframe subsequent to the completion of a partial etching process thereon.

As seen in FIGS. 3 and 4, the generally planar top surfaces of the first connect bars 121 extend in generally co-planar relation to the top surface of the die pad 110. Additionally, the first and second lands 131, 132 of the first connect bars 121 and distal surfaces defined by the connectors 123 thereof each extend in generally co-planar relation to the bottom surface of the die pad 110. The etched surfaces defined by each first connect bar 121 extend in generally co-planar relation to the etched surface 111 of the die pad 110. As will be discussed in more detail below, during the fabrication process for the semiconductor device 1100 including the leadframe 100, the connectors 123 of the first connect bars 121 are removed from the leadframe 100, and the dambar also removed, to electrically isolate the first connect bars 121 from the die pad 110, the second connect bars 122, the corner connect bars 120a, and each other. As seen in FIG. 4, it is contemplated that such removal can be simplified by further subjecting a portion of the top surface of each of the first connect bars 121 to a partial etching process (e.g., a half-etched) as results in each of the connectors 123 having a notch 123a formed therein. The etching of the notch 123a into each connector 123 effectively reduces the original thickness thereof (equal to the full thickness of the first connect bar 121) by approximately one-half. As will also be discussed in more detail below, the encapsulant material used to form the package body of the semiconductor device 100 effectively covers both the lop surfaces and etched surfaces of the first connect bars 121, thus resulting in almost the entirety of each of the first connect bars 121 being encapsulated by the package body, and only the first and second lands 131, 132 thereof being exposed in the bottom surface of the package body.

The second connect bars 122 of the leadframe 100 are integrally connected to the outer frame or dambar of the unsingulated leadframe 100, and extend inwardly toward die pad 110. However, none of the second connect bars 122 is directly attached to the die pad 110. As seen in FIG. 1, the second connect bars 122 are also segregated into four (4) sets, with the first connect bars 121 of each set extending between one of the peripheral edge segments of the die pad 110 and a corresponding one of the four peripheral edge segments of the surrounding outer frame or dambar. Each of the second connect bars 122 has a non-linear configuration. Additionally, each of the first connect bars 121 extends between a corresponding pair of the second connect bars 122.

Like the first connect bars 121, the second connect bars 122 are not of uniform thickness. Rather, portions of the bottom surface of each of the second connect bars 122 are subjected to a partial etching process (e.g., are half-etched) as results in each of the second connect bars 122 having one region which is of increased thickness in comparison to the remainder thereof. In roughly half of the second connect bars 122 of each set, this increased thickness region defines a second land 132 thereof. The increased thickness region of each of the remaining second connect bars 122 of the same set defines a first land 131 thereof. As seen in FIG. 1, the second lands 132 of the second connect bars 122 of each set are disposed closer to the die pad 110 than the first lands 131 of the remaining second connect bars 122 of the same set. Additionally, the first and second lands 131, 132 of the second connect bars 122 of each set are staggered or offset relative to each other.

In the leadframe 100, the generally planar top surfaces of the second connect bars 122 extend in generally co-planar relation to the top surface of the die pad 110. Additionally, the first and second lands 131, 132 of the second connect bars 122 each extend in generally co-planar relation to the bottom surface of the die pad 110. The etched surfaces defined by each second connect bar 122 extend and generally co-planar relation to the etched surface 111 of the die pad 110. As will also be discussed in more detail below, during the fabrication process for the semiconductor device 1100 including the leadframe 100, the removal of the dambar from the leadframe 100 effectively electrically isolates the second connect bars 122 from each other, and from the first connect bars 121 and the corner connect bars 120a. As will also be discussed in more detail below, the encapsulant material used to form the package body of the semiconductor device 100 effectively covers both the top surfaces and etched surfaces of the second connect bars 122, thus resulting in almost the entirety of each of the second connect bars 122 being encapsulated by the package body, and only the first and second lands 131, 132 thereof being exposed in the bottom surface of the package body.

The corner connect bars 120a of the leadframe 100 are integrally connected to the outer frame or dambar of the unsingulated leadframe 100, and extend inwardly toward die pad 110. However, none of the corner connect bars 120a is directly attached to the die pad 110. Each of the corner connect bars 120a has a non-linear configuration. Also, as seen in FIG. 1, the corner connect bars 120a are segregated into four (4) sets. More particularly, inner portions of the corner connect bars 120a of each set extend generally diagonally from a respective one of the corner regions of the die pad 110 in spaced relation thereto and in side-by-side relation to each other, with outer portions of the corner connect bars 120a of the same set extending to corresponding ones of the four peripheral edge segments of the surrounding outer frame or dambar.

The corner connect bars 120a are also not of uniform thickness. Rather, portions of the bottom surface of each of the corner connect bars 120a are subjected to a partial etching process (e.g., are half-etched) as results in each of the corner connect bars 120a having one region which is of increased thickness in comparison to the remainder thereof. In each of the corner connect bars 120a of each set, this increased thickness region defines a corner land 130a thereof. As seen in FIG. 1, the corner land 130a defined by each of the corner connect bars 120a of each set is generally aligned with the first lands 131 defined by a corresponding set of the interleaved first and second connect bars 121, 122.

In the leadframe 100, the generally planar top surfaces of the corner connect bars 120a extend in generally co-planar relation to the top surface of the die pad 110. Additionally, the corner lands 130a of the corner connect bars 120a each extend in generally co-planar relation to the bottom surface of the die pad 110. The etched surfaces defined by each corner connect bar 120a extend and generally co-planar relation to the etched surface 111 of the die pad 110. As will also be discussed in more detail below, during the fabrication process for the semiconductor device 1100 including the leadframe 100, the removal of the dambar from the leadframe 100 effectively electrically isolates the corner connect bars 120a from each other, and from the first and second connect bars 121, 122. As will also be discussed in more detail below, the encapsulant material used to form the package body of the semiconductor device 1100 effectively covers both the top surfaces and etched surfaces of the corner connect bars 120a, thus resulting in almost the entirety of each of the corner connect bars 120a being encapsulated by the package body, and only the corner lands 130a thereof being exposed in the bottom surface of the package body.

As is most apparent from FIG. 1, due to the structural features of the leadframe 100 as described above, the second lands 132 defined by the first and second connect bars 121, 122 are arranged in a generally quadrangular pattern which circumvents the die pad 110. Similarly, the first lands 131 defined by the first and second connect bars 121, 122 and the corner lands 130a defined by the corner connect bars 120a are arranged in a generally quadrangular pattern which circumvents the second lands 132, i.e., the second lands 132 are generally concentrically positioned between the die pad 110 and the first lands 131 and corner lands 130a. Additionally, the second lands 132, like the first and second connect bars 121, 122, are segregated into four (4) sets, with each such set of the second lands 132 extending along a respective one of the peripheral edge segments defined by die pad 110. Similarly, the first lands 131 are also segregated into the four (4) sets, with each such set also extending along respective one of peripheral edge segments defined by the die pad 110. As indicated above, each of the corner lands 130a is aligned with a corresponding set of the first lands 131. Further, each set of the second lands 132 collectively defined by corresponding sets of the first and second connect bars 121, 122 is staggered or offset relative to a corresponding set of the first and corner lands 131, 130a collectively defined by corresponding sets of the first, second and corner connect bars 121, 122, 120a.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. Additionally, the number of first and second connect bars 121, 122 shown in FIG. 1 is for illustrative purposes only, and may be modified according to application field. Along these lines, the first and second connect bars 121, 122 may have designs or configurations varying from those shown in FIG. 1 without departing from the spirit and scope of the present invention. Additionally, though the first, second and corner connect bars 121, 122, 120a are each shown as being segregated into four sets, it will be recognized that fewer sets thereof may be provided, and may be arranged along any combination of two or three of the peripheral sides or corners of the die pad 110. It is further contemplated that the leadframe 100 may be fabricated through the implementation of a chemical etching process or alternatively a mechanical stamping process.

Referring now to FIGS. 9-12, the semiconductor device or package 1100 as fabricated to include the leadframe 100 is shown in detail. As will be recognized by those of ordinary skill in the art, in the completed semiconductor device 1100 shown in FIGS. 9-12, the dambar and connectors 123 are each singulated or removed from the leadframe 100 to facilitate the electrical isolation of the various structural features of the leadframe 100 from each other. As indicated above, the dambar and the connectors 123 are singulated in a manner wherein the first, second and corner connect bars 121, 122, 120a, and hence the first, second and corner lands 131, 132, 130a, are electrically isolated from each other, and from the die pad 110.

In the semiconductor device 1100, a semiconductor die 140 is attached to the top surface of the die pad 110 through the use of an adhesive layer 141. The semiconductor die 140 includes a plurality of bond pads 142 which are disposed on the top surface thereof opposite the bottom surface adhered to the adhesive layer 141. The bond pads 142 are used to deliver and receive electrical signals.

Figure 10:
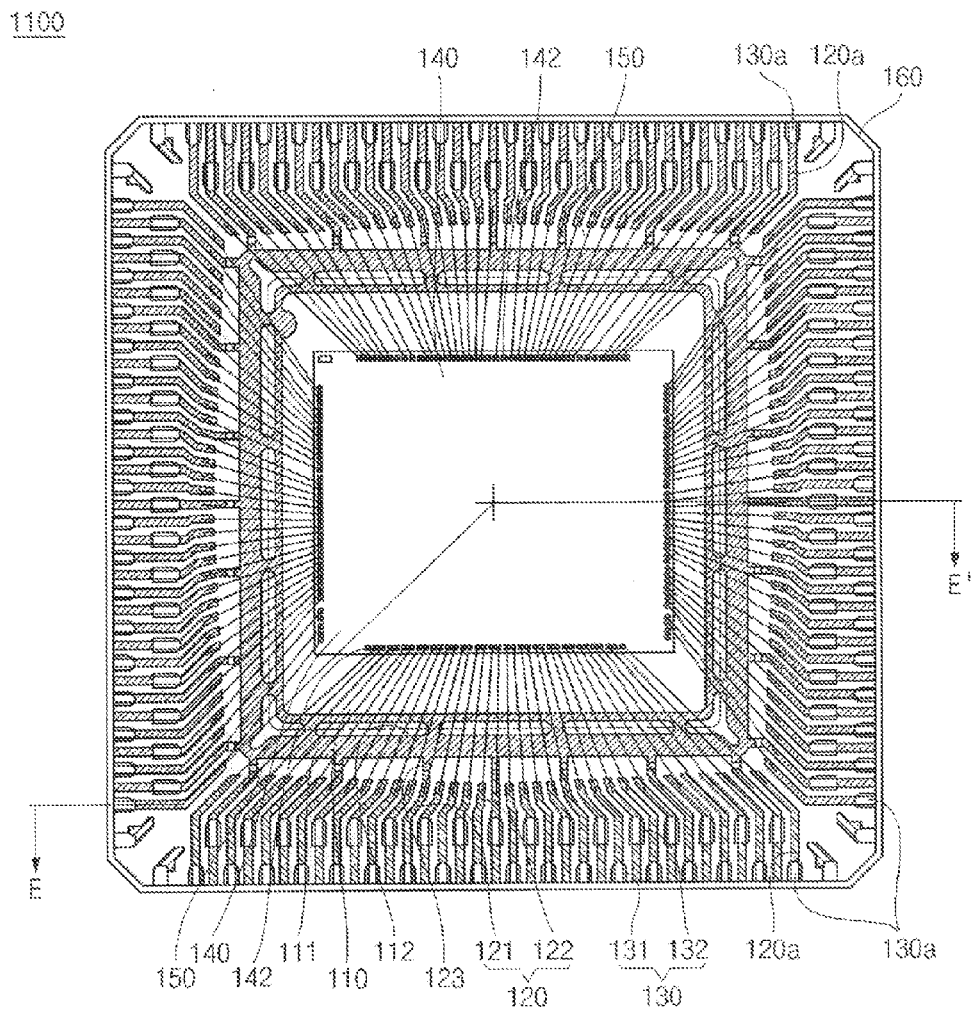
FIG. 10 is a top plan view of the semiconductor device of the first embodiment similar to FIG. 9, but with the package body partially removed so as to depict the internal features thereof.

The semiconductor device 1100 further comprises a plurality of conductive wires 150 which are used to electrically connect the bond pads 142 of the semiconductor die 140 to respective ones of the first, second and corner connect bars 121, 122, 120a, and hence the first, second and corner lands 131, 132, 130a. More particularly, as seen in FIG. 10, the wires 150 are extended to the top surfaces of respective ones of the first, second and corner connect bars 121, 122, 120a. The conductive wires 150 may be fabricated from aluminum, copper, gold, silver, or a functional equivalent. However, those of ordinary skill in the art will recognize that the present invention is not limited to any particular material for the wires 150. One or more conductive wires 150 may also be used to electrically connect one or more bond pads 142 of the semiconductor die 140 directly to the die pad 110.

In the semiconductor device 1100, the die pad 110, the first, second and corner connect bars 121, 122, 120a, the semiconductor die 140 and the conductive wires 150 are at least partially encapsulated or covered by an encapsulant material which, upon hardening, forms the package body 160 of the semiconductor device 1100. More particularly, the package body 160 covers the entirety of the die pad 110 (including the etched surface 111) except for the bottom surface thereof which is circumvented by the etched surface 111. The package body 160 also covers the top and etched surfaces of the first, second and corner connect bars 121, 122, 120a, as well as portions of the side surfaces thereof. However, the package body 160 does not cover the those surfaces of the first, second and corner connect bars 121, 122, 120a, which define the first, second and corner lands 131, 132, 130a. As such, in the completed semiconductor device 1100, the bottom surface of the die pad 110, and the first, second and corner lands 131, 132, 130a are exposed in and substantially flush with a generally planar bottom surface 161 defined by the package body 160. During the process of fabricating the semiconductor device 1100, the dambar and portions of the connectors 123 of the first connect bars 121 are also not covered by the package body 160 so that they may be removed from the leadframe 100.

Figure 17:
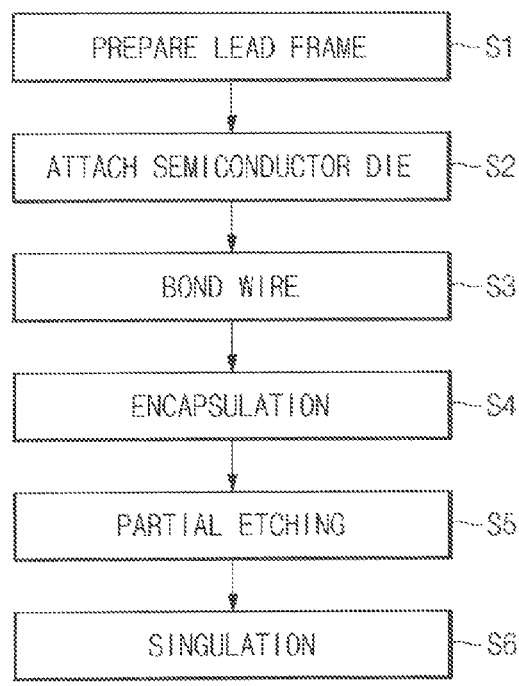
FIG. 17 is a flow chart illustrating an exemplary fabrication method for the semiconductor device of the first embodiment shown in FIGS. 9-12.

Referring now to FIG. 17, there is provided a flow chart which sets forth an exemplary method for fabricating the semiconductor device 1100 of the present invention. The method comprises the steps of preparing the leadframe (S1), semiconductor die attachment (S2), wire bonding (S3), encapsulation (S4), partial etching (S5), and singulation (S6). FIGS. 18A-18I provide illustrations corresponding to these particular steps, as will be discussed in more detail below.

Figure 18A:
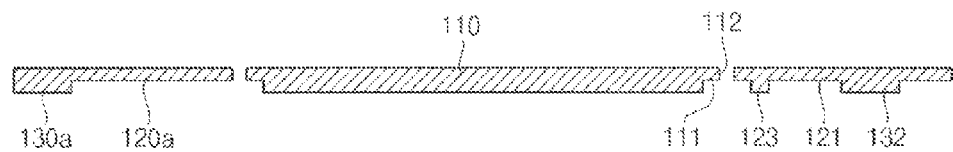
FIGS. 18A-18I are views illustrating an exemplary fabrication method for the semiconductor device of the first embodiment shown in FIGS. 9-12.
Figure 18B:
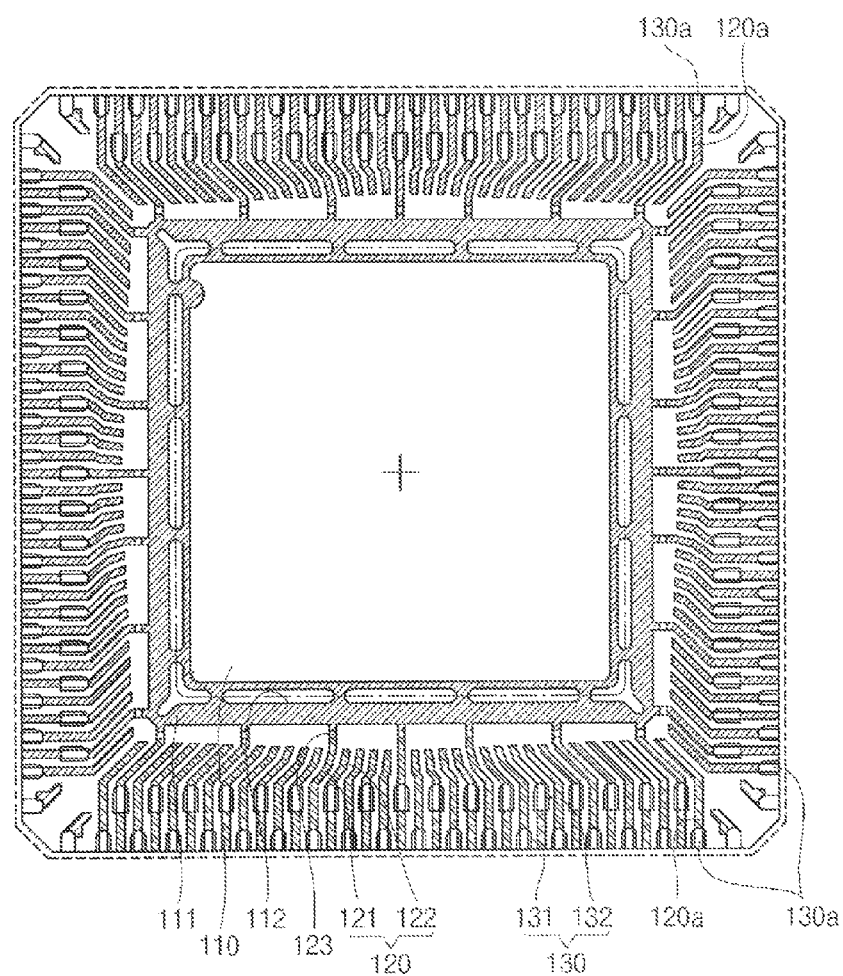
Figure 18C:
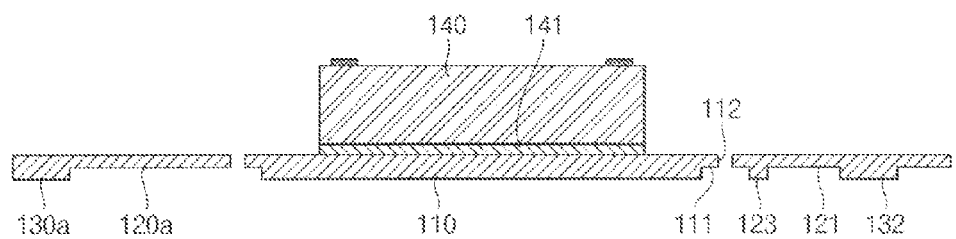
Figure 18D:
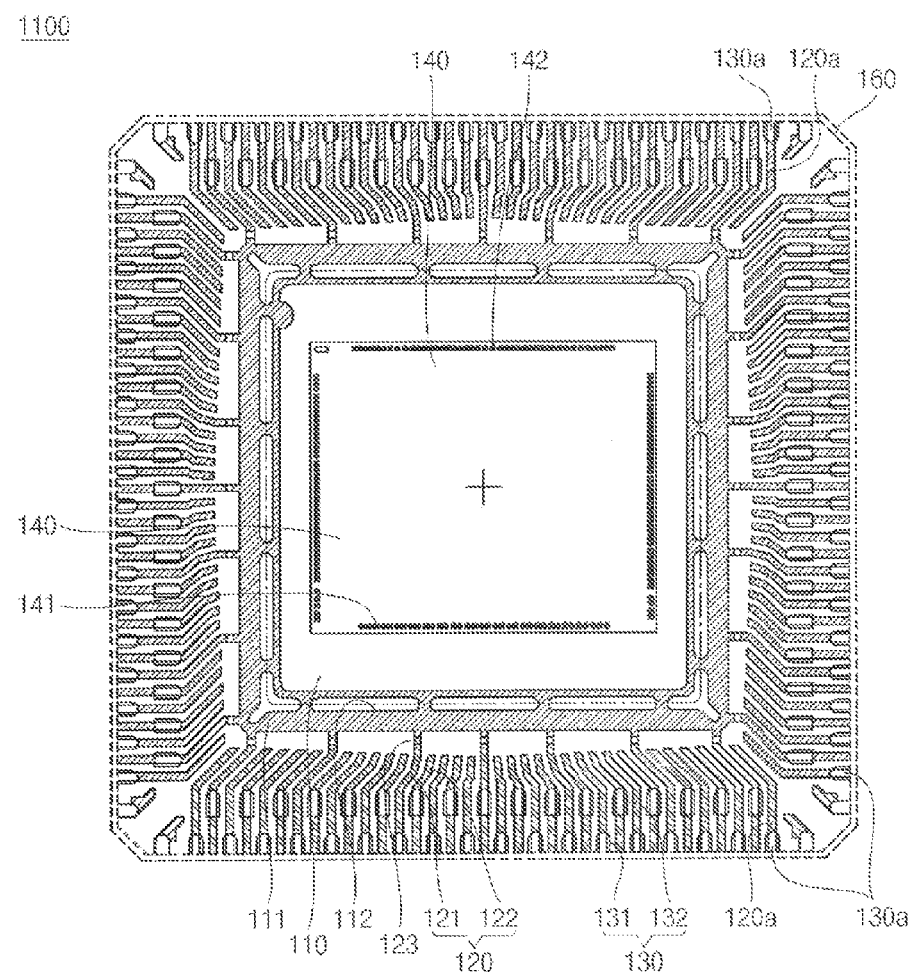

Referring now to FIGS. 18A and 18B, in the initial step S1 of the fabrication process for the semiconductor device 1100, the leadframe 100 is provided by etching a suitably shaped piece of metal material to define the above-described structural features. Thereafter, as illustrated in FIGS. 18C and 18D, step S2 is completed wherein the semiconductor die 140 having the bond pads 142 is attached to the top surface of the die pad 110 of the leadframe 100 through the use of the adhesive layer 141. The adhesive layer 141 can be selected from well known liquid epoxy adhesives, adhesive films and adhesive tapes, as well as equivalents thereto.

Figure 18E:
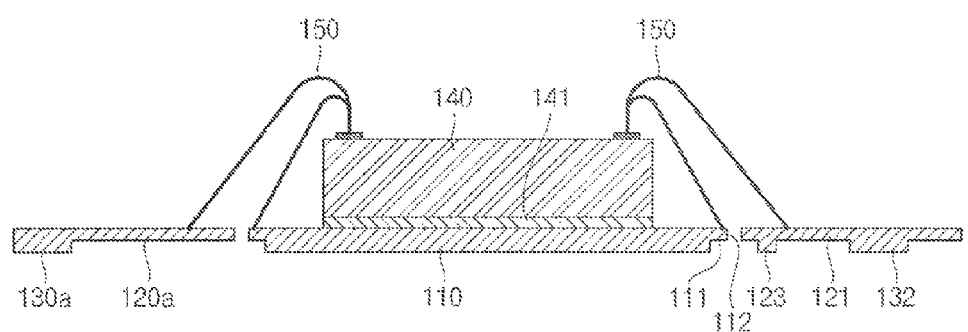
Figure 18F:
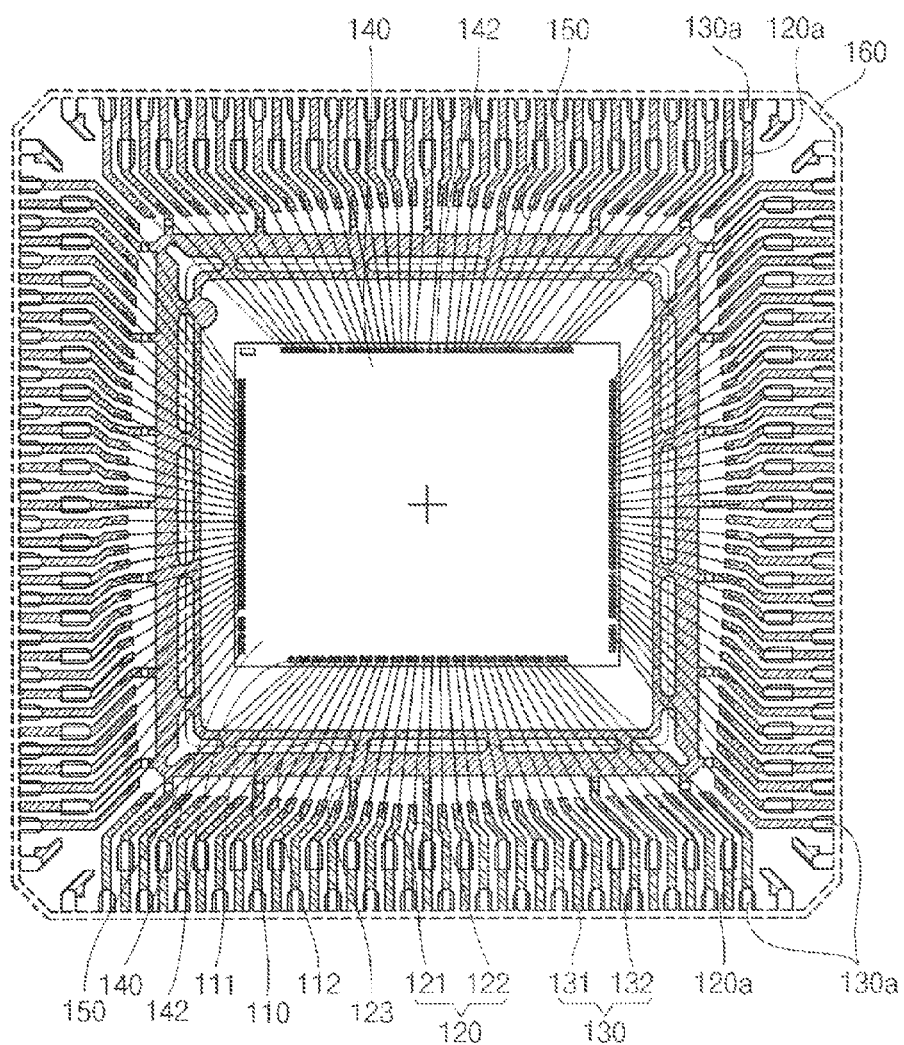

Referring now to FIGS. 18E and 18F, in the next step S3 of the fabrication process, the conductive wires 150 are used to electrically interconnect the semiconductor die 140 to the leadframe 100 in the aforementioned manner. Specifically, the bond pads 142 of the semiconductor die 140 are electrically connected to the top surfaces of the first, second and corner connect bars 121, 122, 120a. Though not shown, as indicated above, one or more conductive wires 150 may also be used to electrically connect one or more bond pads 142 of the semiconductor die 140 directly to the die pad 110, allowing for the use of the die pad 110 as a ground region.

Figure 18G:
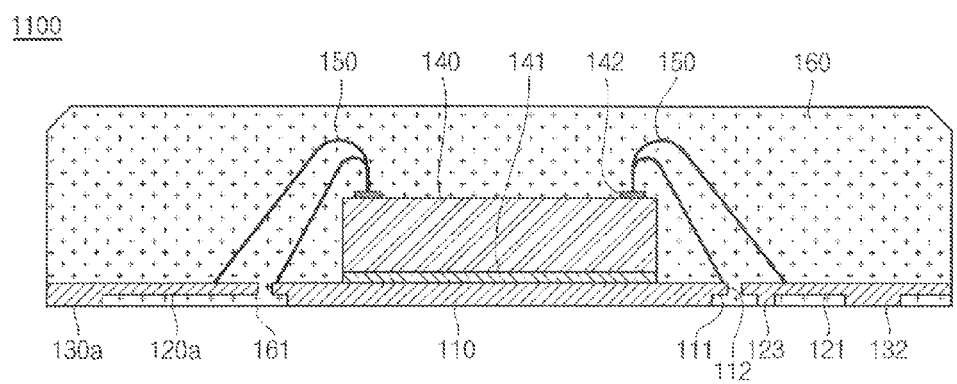
Figure 18H:
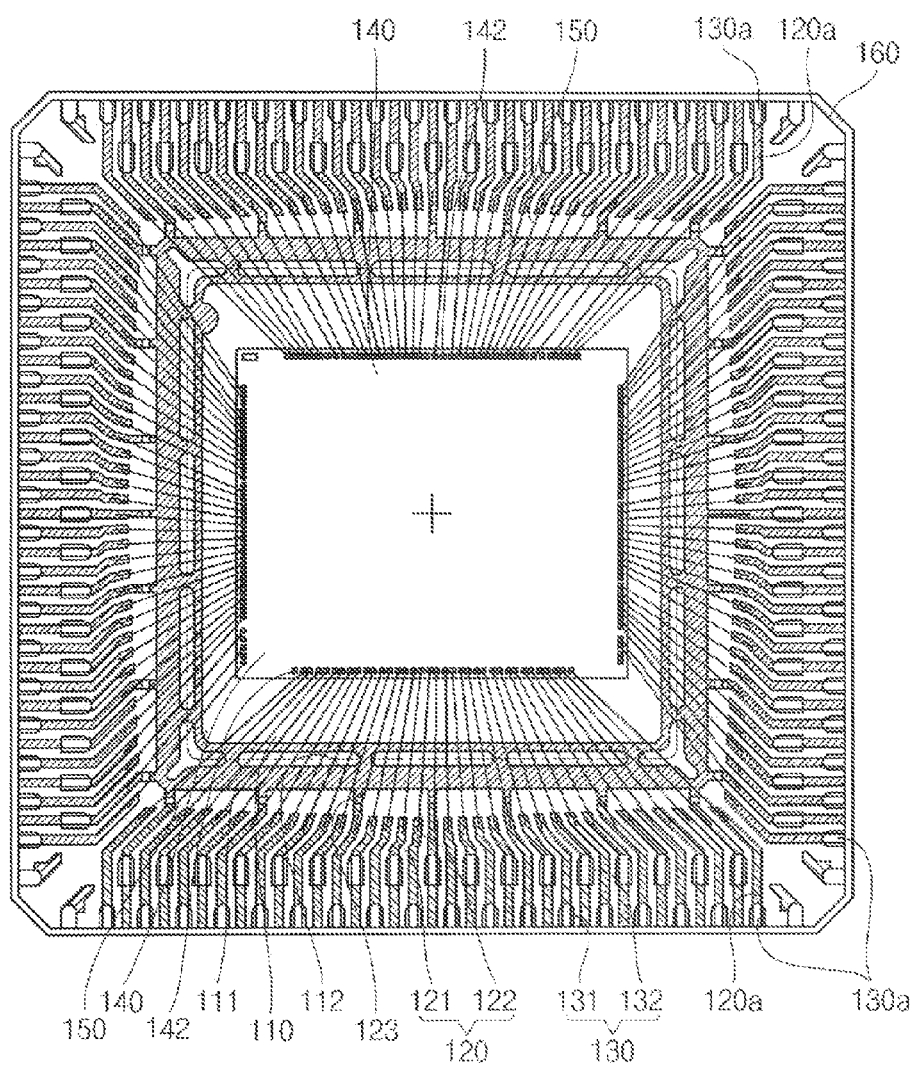

Referring now to FIGS. 18G and 18H, in the next step S4 of the fabrication process for the semiconductor device 1100, portions of the leadframe 100, the semiconductor die 140 and the conductive wires 150 are encapsulated with an encapsulant material which, upon hardening, forms the package body 160 of the semiconductor device 1100. More particularly, as indicated above, the package body 160 covers the entirety of the die pad 110 (including the etched surface 111) except for the bottom surface thereof which is circumvented by the etched surface 111. The package body 160 also covers the top and etched surfaces of the first, second and corner connect bars 121, 122, 120a, as well as portions of the side surfaces thereof. However, the package body 730 does not cover the those surfaces of the first, second and corner connect bars 121, 122, 120a, which define the first, second and corner lands 131, 132, 130a. As such, in the completed semiconductor device 1100, the bottom surface of the die pad 110, and the first, second and corner lands 131, 132, 130a are exposed in and substantially flush with a generally planar bottom surface 161 defined by the package body 160. The dambar and portions of the connectors 123 of the first connect bars 121 are also not covered by the package body 160 so that they may be removed from the leadframe 100 in a subsequent step of the fabrication process.

Figure 11:
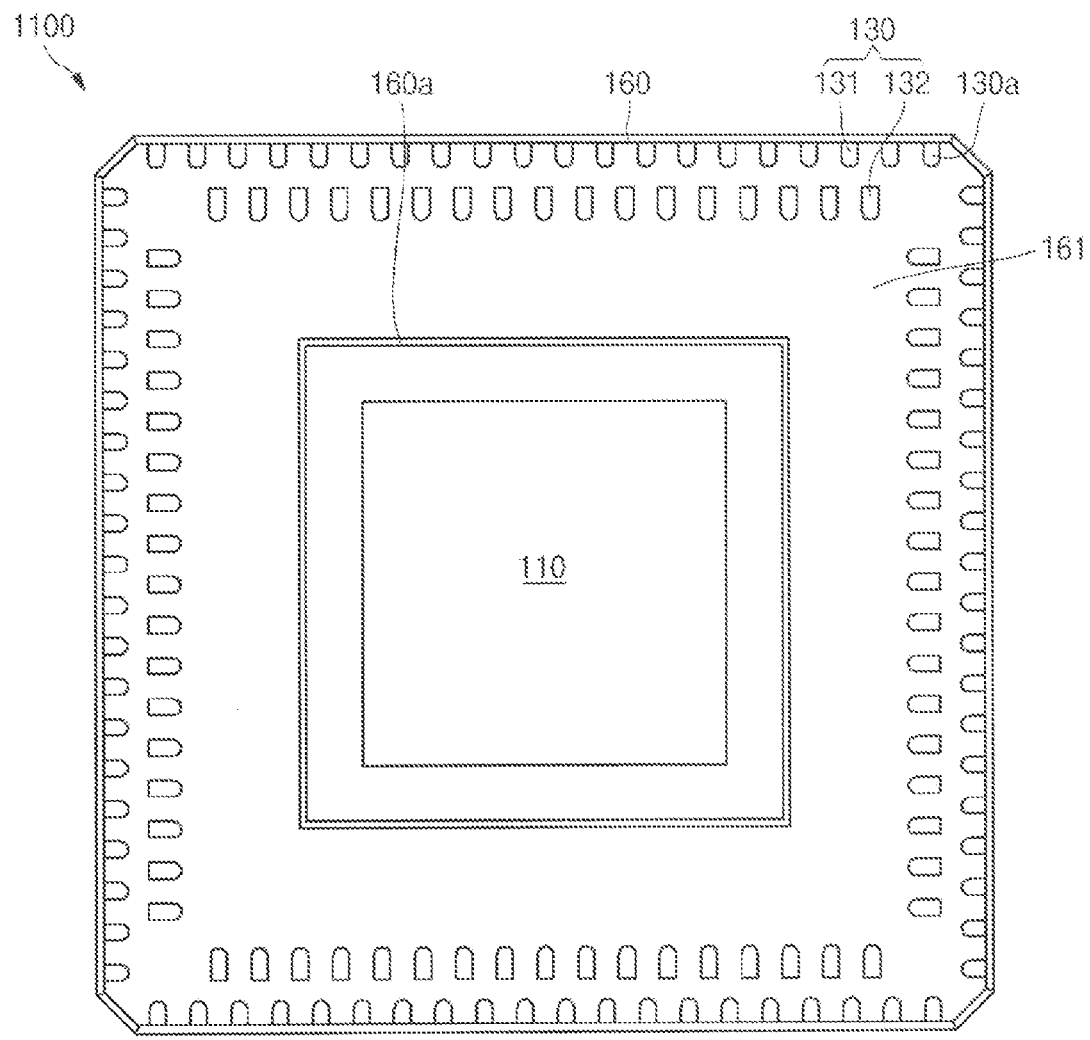
FIG. 11 is a bottom plan view of the semiconductor device of the first embodiment as fabricated to include the leadframe shown in FIGS. 1-4.
Figure 12:
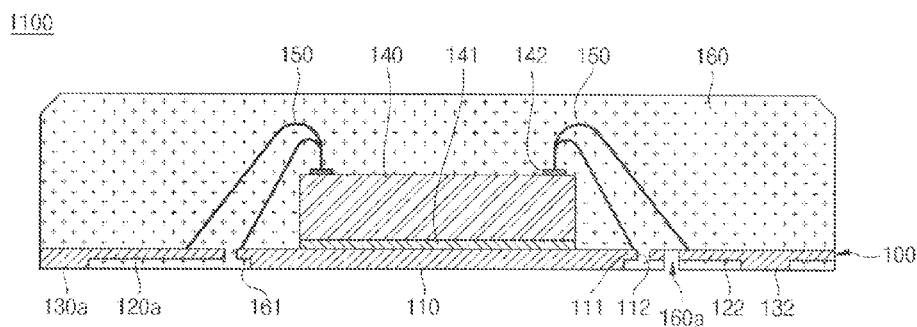
FIG. 12 is a cross-sectional view of the semiconductor device of the first embodiment taken along line E-E' of FIG. 10.
Figure 13:
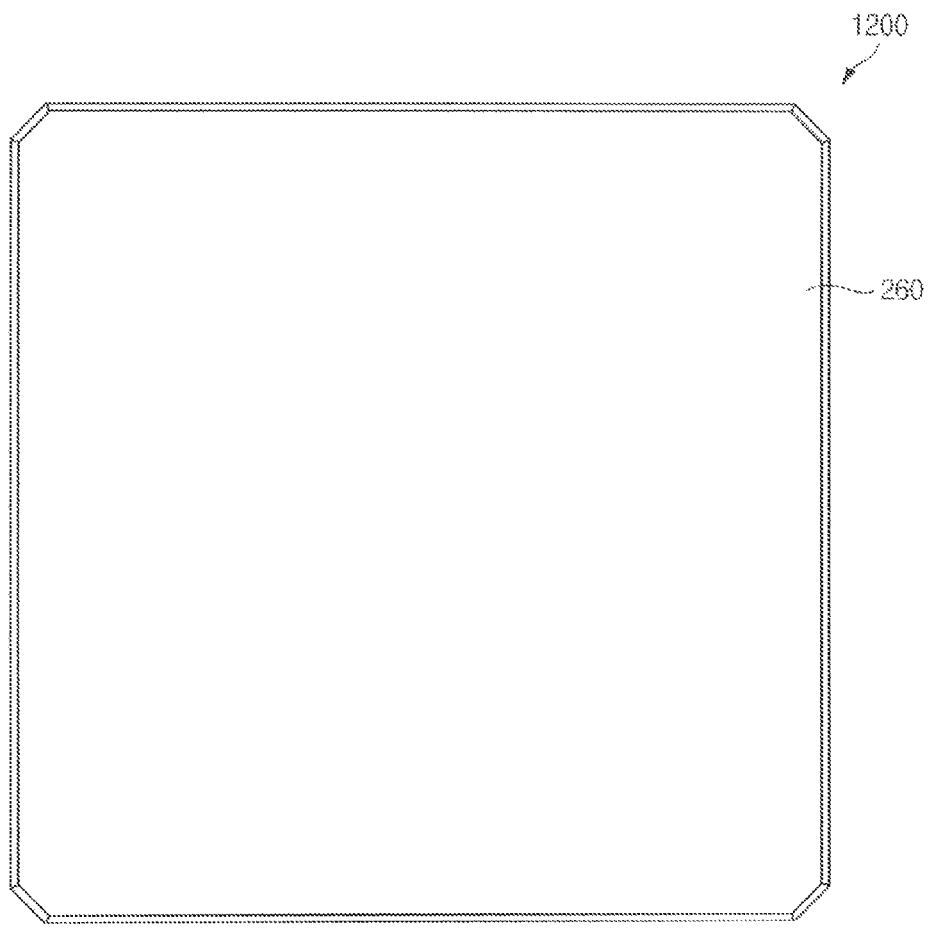
FIG. 13 is a top plan view of the semiconductor device of the second embodiment as fabricated to include the leadframe shown in FIGS. 5-8.
Figure 18I:
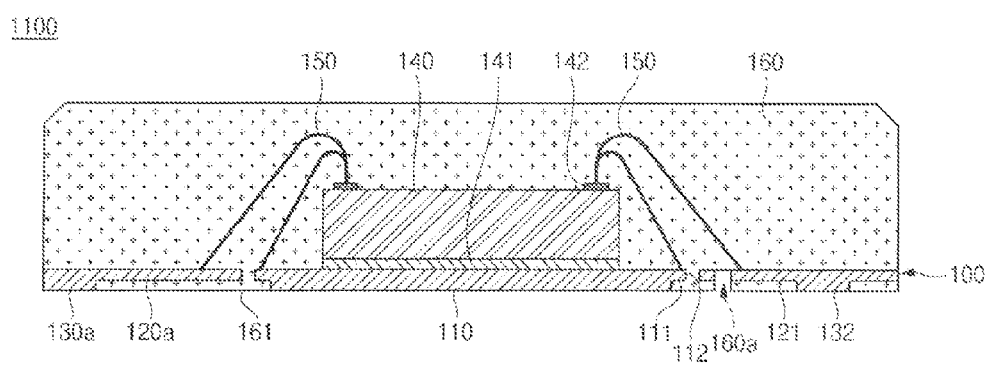

Referring now to FIG. 18I, in the next step S5 of the fabrication process for the semiconductor device 1100, the removal of the connectors 123 of the first connect bars 121 is facilitated by the completion of an etching process. More particularly, it is contemplated that a photoresist may be applied to the bottom surface 161 of the package body 160, and in particular on to the exposed bottom surface of the die pad 110 and to the first, second and corner lands 131, 132, 130a. The photoresist is then patterned so as to facilitate the necessary exposure of those portions of the connectors 123 which are exposed in the bottom surface 161 of the package body 160. A wet etching process is then performed as facilitates the removal of the connectors 123, and thus the separation of the first connect bars 121 from the die pad 110. As previously explained, during the process of forming the leadframe 100 in accordance with step S1, the notches 123a may be etched into respective ones of the connectors 123 as effectively reduces the thickness thereof and simplifies the process of removing the same by the application of a suitable etchant thereto. As seen in FIGS. 11 and 18I, a trench or recess 160a may be formed in the bottom surface 161 of the package body 160 as an artifact of the etching process used to facilitate the removal of the connectors 123.

In the last step S6 of the fabrication process for the semiconductor device 1100, the outer frame or dambar is trimmed or removed by cutting with a cutting tool so that the first, second and corner connect bars 121, 122, 120a, and hence the first, second and corner lands 131. 132, 130a, are electrically isolated from each other and from the die pad 110. It is contemplated that the dambar will be positioned outside of the package body 160 to allow for the removal thereof from the leadframe 100, and is removed by cutting the same with a dambar cutting tool. It is contemplated that the removal of the dambar may also result in distal, outer ends of the first, second and corner connect bars 121, 122, 120a being exposed in and substantially flush with a peripheral outer surface of the package body 160.

In the semiconductor device 1100, the structural attributes of the leadframe 100 allow the lengths of the conductive wires 150 extending between the bond pads 142 of the semiconductor die 140 and the first, second and corner connect bars 121, 122, 120a to be minimized, thereby reducing the complexity of and fabricating costs related to the semiconductor device 1100. Further, the leadframe 100 is uniquely configured so that conventional tie bars which would otherwise extend diagonally from each of the four corners of the die pad 110 are replaced with each set of the corner connect bars 120a which are configured to extend to terminate in close proximity to the die pad 110. The inclusion of the corner connect bars 120a, and hence the corner lands 130a defined thereby, effectively increases the number of input/output terminals in the semiconductor device 1100, with the structural attributes of the corner connect bars 120a allowing for the lengths of the conductive wires 150 extending thereto to be decreased or minimized, thereby reducing the complexity of and fabricating costs related to the semiconductor device 1100 as indicated above.

Figure 5:
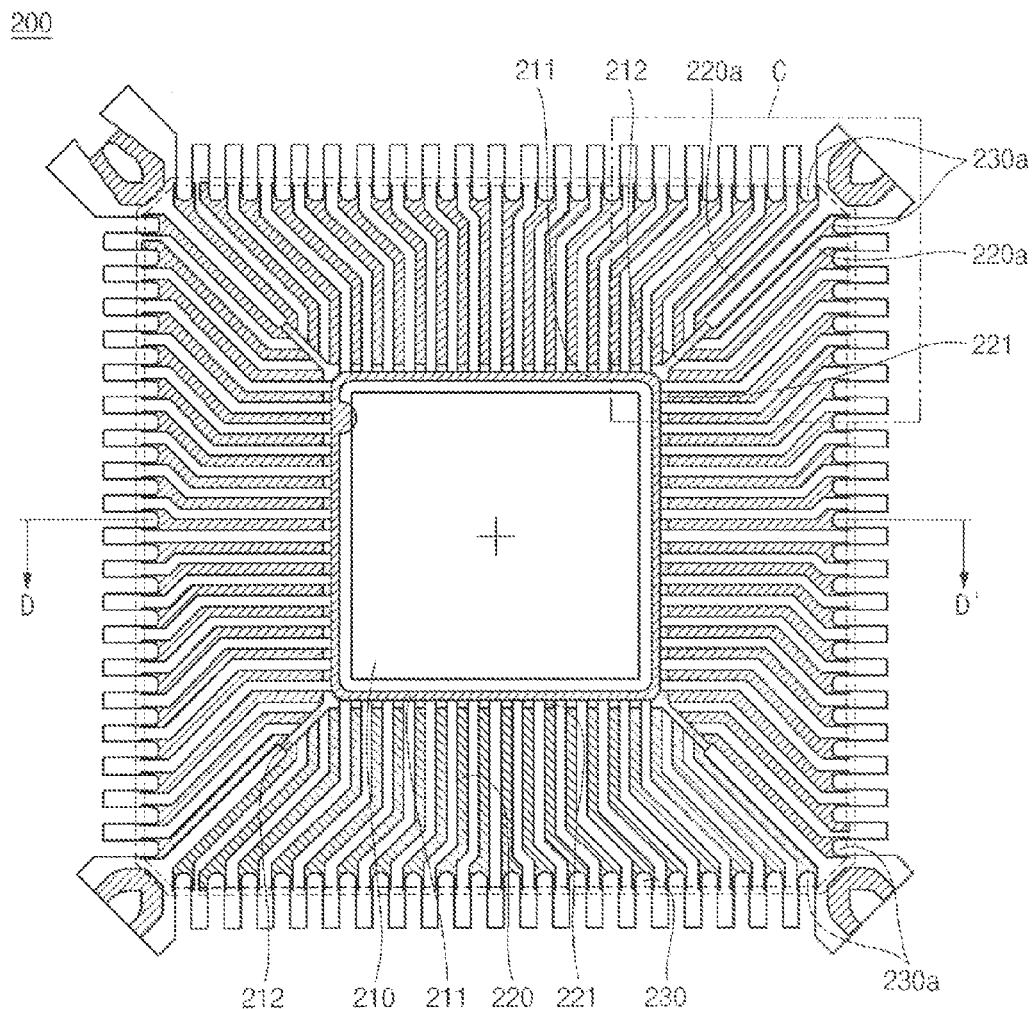
FIG. 5 is a top plan view of an unsingulated leadframe which is integrated into a semiconductor device or package constructed in accordance with a second embodiment of the present invention.
Figure 6:
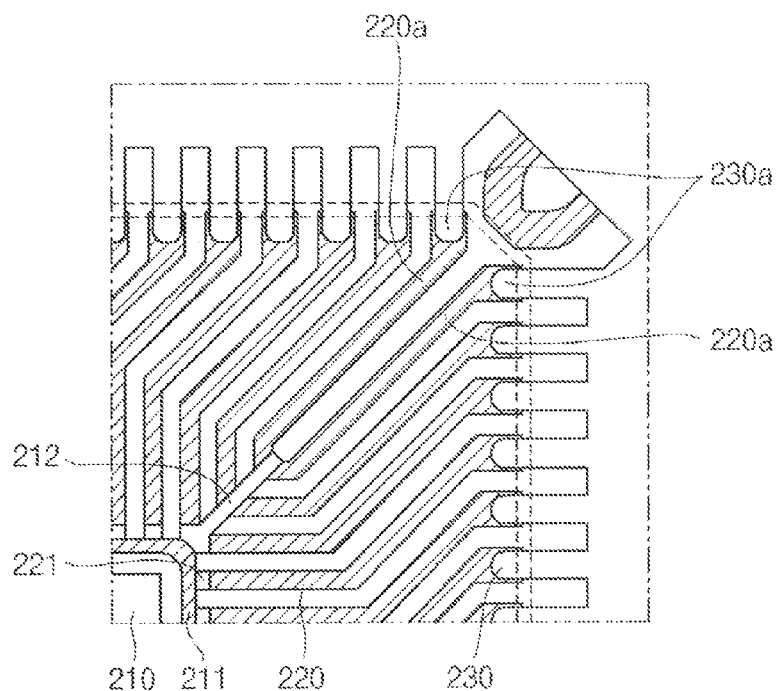
FIG. 6 is an enlargement of the region C of FIG. 5.

Referring now to FIGS. 5-8, there is shown an unsingulated leadframe 200 which is integrated into a semiconductor device 1200 constructed in accordance with a second embodiment of the present invention, and shown in FIGS. 13-16. The leadframe 200 comprises a generally quadrangular (e.g., square) die paddle or die pad 210 which defines four peripheral edge segments and four corner regions. The peripheral edge segments of the die pad 210 are defined by a peripheral region thereof. Additionally, when viewed from the perspective shown in FIGS. 7 and 8, the die pad 210 defines opposed, generally planar top and bottom surfaces. As is further most easily seen in FIGS. 7 and 8, the die pad 210 of the leadframe 200 is not of uniform thickness. Rather, a peripheral portion of the bottom surface of the die pad 210 is partially etched (e.g., half-etched) to define an etched surface 211. More particularly, the etched surface 211, which is recessed relative to the remainder of the bottom surface of the die pad 210, extends about the entire periphery of the die pad 200, and thus along each of the peripheral edge segments defined thereby. In FIGS. 5 and 6, the etched surface 211 in the bottom surface of the die pad 210 is indicated by the condensed hatching which slopes downwardly from right to left.

As will be also discussed in more detail below, in the fabrication process for the semiconductor device 1200 including the leadfame 200, a semiconductor die is attached to the top surface of the die pad 210 through the use of an adhesive layer, with an encapsulant material thereafter being applied to the semiconductor die and the leadframe 200 to form the package body of the semiconductor device 1200. Advantageously, the etched surface 211 formed in the peripheral portion of the bottom surface of the die pad 210 as indicated above effectively increases the distance along which moisture must travel to reach the semiconductor die mounted to the top surface of the die pad 210. As a result, such semiconductor die is safely protected against moisture in the completed semiconductor device 1200. Additionally, the flow of encapsulant material over the etched surface 211 during the formation of the package body of the semiconductor device 1200 facilitates the creation of a mechanical interlock between the package body and the die pad 210.

Integrally connected to the die pad 210 are a plurality of extension bars 212. More particularly, the leadframe 200 includes four extension bars 212 which extend diagonally from respective ones of the four corner regions defined by the die pad 210. The extension bars 212 are identically configured to each other, and extend diagonally outwardly at predetermined lengths from respective ones of the corner regions of the die pad 210. Each of the extension bars 212 defines opposed, generally planar top and bottom surfaces which extend in generally co-planar relation to respective ones of the top and bottom surface of the die pad 210. During the fabrication process for the semiconductor device 1200 including the leadframe 200, the encapsulant material used to form the package body of the semiconductor device 1200 does not completely cover the extension bars 212, thus allowing for the removal thereof in a manner which will be described in more detail below.

The leadframe 200 of the semiconductor device 1200 further comprises a plurality of connect bars 220 which define a plurality of lands 230, and a plurality of corner connect bars 220a which define a plurality of corner lands 230a. As best seen in FIGS. 5 and 6, the connect bars 220 are integrally connected to extend between the die pad 210 and a generally quadrangular outer frame or dambar (not shown) of the unsingulated leadframe 200 which circumvents the die pad 210. The connect bars 220 are segregated into four (4) sets, with the majority of the connect bars 220 of each set extending between one of the peripheral edge segments of the die pad 210 and a corresponding one of the four peripheral edge segments of the surrounding outer frame or dambar. Of the connect bars 220 of each set, the two central or middle connect bars 220 each have a straight, generally linear configuration, with the remaining connect bars 220 of the same set each having a non-linear configuration. As further seen in FIG. 5, the two outmost pairs of the connect bars 220 of each set are not attached to a corresponding peripheral edge segment of the die pad 210, but rather attached to respective ones of an adjacent pair of the extension bars 212.

As seen in FIGS. 5-8, the connect bars 220 are not of uniform thickness. Rather, portions of the bottom surface of each of the connect bars 220 are subjected to a partial etching process (e.g., are half-etched) as results in each of the connect bars 220 (other than those which are attached to the extension bars 212) having two (2) regions which are of increased thickness in comparison to the remainder thereof. One of these increased thickness regions of these connect bars 220 defines a land 230 thereof, with the remaining increased thickness region defining a connector 221. Those connect bars 220 which are attached to the extension bars 212 each have one (1) region which is of increased thickness in comparison to the remainder thereof; such increased thickness region also defining a land 230 thereof.

Figure 7:
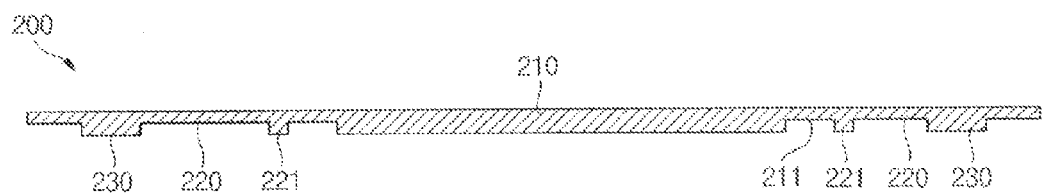
FIG. 7 is a cross-sectional view of the leadframe taken along line D-D' of FIG. 5.
Figure 8:
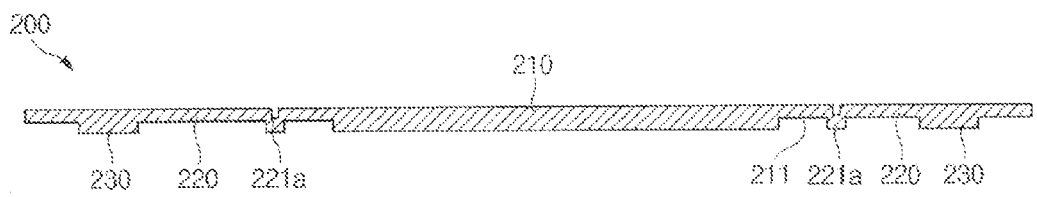
FIG. 8 is a cross-sectional view identical to FIG. 7 but depicting the leadframe subsequent to the completion of a partial etching process thereon.
Figure 9:
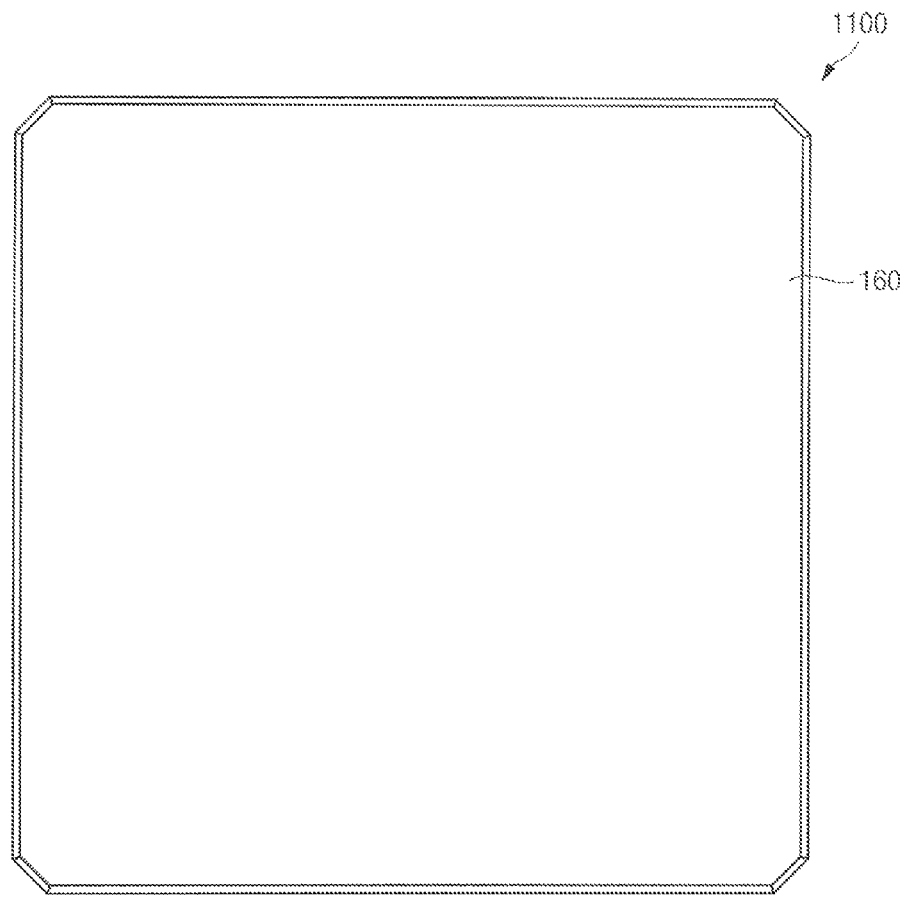
FIG. 9 is a top plan view of the semiconductor device of the first embodiment as fabricated to include the leadframe shown in FIGS. 1-4.

As seen in FIGS. 7 and 8, the generally planar top surfaces of the connect bars 220 extend in generally co-planar relation to the top surface of the die pad 210. Additionally, the lands 230 of the connect bars 220 and distal surfaces defined by the connectors 212 thereof each extend in generally co-planar relation to the bottom surface of the die pad 210. The etched surfaces defined by the connect bars 220 extend in generally co-planar relation to the etched surface 211 of the die pad 210. As will be discussed in more detail below, during the fabrication process for the semiconductor device 1200 including the leadframe 200, the connectors 221 of the connect bars 220 are removed from the leadframe 200, along with the extension bars 212 and the dambar, to electrically isolate the connect bars 220 and the corner connect bars 220a from the die pad 210 and each other. As seen in FIG. 8, it is contemplated that the removal of the connectors 221 can be simplified by further subjecting a portion of the top surface of each of those connect bars 220 including the same to a partial etching process (e.g., a half-etched) as results in each of the connectors 221 having a notch 221a formed therein. The etching of the notch 221a into each connector 221 effectively reduces the original thickness thereof (equal to the full thickness of the connect bar 220) by approximately one-half. As will also be discussed in more detail below, the encapsulant material used to form the package body of the semiconductor device 200 effectively covers both the top surfaces and etched surfaces of the connect bars 220, thus resulting in almost the entirety of each of the connect bars 220 being encapsulated by the package body, and only the lands 230 and thereof being exposed in the bottom surface of the package body.

The corner connect bars 220a of the leadframe 200 are integrally connected to and extend between the outer frame or dambar of the unsingulated leadframe 200, and respective ones of the extension bars 212. Each of the corner connect bars 220a has a non-linear configuration. Also, as seen in FIG. 5, the corner connect bars 220a are segregated into four (4) sets. More particularly, inner portions of the corner connect bars 220a of each set extend from a respective one of the extension bars 212 in spaced, side-by-side relation to each other, with outer portions of the corner connect bars 220a of the same set extending to corresponding ones of the four peripheral edge segments of the surrounding outer frame or dambar.

The corner connect bars 220a are also not of uniform thickness. Rather, portions of the bottom surface of each of the corner connect bars 220a are subjected to a partial etching process (e.g., are half-etched) as results in each of the corner connect bars 220a having one region which is of increased thickness in comparison to the remainder thereof. In each of the corner connect bars 220a of each set, this increased thickness region defines a corner land 230a thereof. As seen in FIG. 5, the corner land 230a defined by each of the corner connect bars 220a of each set is generally aligned with the lands 230 defined by a corresponding set of the connect bars 220.

In the leadframe 200, the generally planar top surfaces of the corner connect bars 220a extend in generally co-planar relation to the top surface of the die pad 210. Additionally, the corner lands 230a of the corner connect bars 220a each extend in generally co-planar relation to the bottom surface of the die pad 110. The etched surfaces defined by each corner connect bar 220a extend and generally co-planar relation to the etched surface 211 of the die pad 210. As indicated and discussed in more detail below, during the fabrication process for the semiconductor device 1200 including the leadframe 200, the removal of the dambar and the extension bars 212 from the leadframe 200 effectively electrically isolates the corner connect bars 220a from each other, and from the connect bars 220 and die pad 210. Further, the encapsulant material used to form the package body of the semiconductor device 1200 effectively covers both the top surfaces and etched surfaces of the corner connect bars 220a, thus resulting in almost the entirety of each of the corner connect bars 120a being encapsulated by the package body, and only the corner lands 230a thereof being exposed in the bottom surface of the package body.

As is most apparent from FIG. 5, due to the structural features of the leadframe 200 as described above, the lands 230 and corner lands 230a are arranged in a generally quadrangular pattern which circumvents the die pad 210. Additionally, the lands 230 and corner lands 230a, like the connect and corner connect bars 220, 220a, are segregated into four (4) sets, with each such set extending along a respective one of the peripheral edge segments defined by die pad 210. As indicated above, each of the corner lands 230a is aligned with a corresponding set of the lands 230.

The leadframe 200 may be fabricated from a conventional metal material, such as copper, copper alloy, steel plated with copper, or a functional equivalent. However, those of ordinary skill in the art will recognize that the present invention is not limited to any particular material for the leadframe 200. Additionally, the number of connect bars 220 shown in FIG. 5 is for illustrative purposes only, and may be modified according to application field. Along these lines, the connect bars 220 may have designs or configurations varying from those shown in FIG. 5 without departing from the spirit and scope of the present invention. Additionally, though the connect and corner connect bars 220, 220a are each shown as being segregated into four sets, it will be recognized that fewer sets thereof may be provided, and may be arranged along any combination of two or three of the peripheral sides or corners of the die pad 210. It is further contemplated that the leadframe 200 may be fabricated through the implementation of a chemical etching process or alternatively a mechanical stamping process.

Referring now to FIGS. 13-16, the semiconductor device or package 1200 as fabricated to include the leadframe 200 is shown in detail. As will be recognized by those of ordinary skill in the art, in the completed semiconductor device 1200 shown in FIGS. 13, 14 and 16, the dambar, connectors 221 and extension bars 212 are each singulated or removed from the leadframe 200 to facilitate the electrical isolation of the various structural features of the leadframe 200 from each other. As indicated above, the dambar, connectors 221 and extension bars 212 are singulated in a manner wherein connect and corner connect bars 220, 220a, and hence the lands and corner lands 230, 230a, are electrically isolated from each other, and from the die pad 210.

In the semiconductor device 1200, a semiconductor die 240 is attached to the top surface of the die pad 210 through the use of an adhesive layer 241. The semiconductor die 240 includes a plurality of bond pads 242 which are disposed on the top surface thereof opposite the bottom surface adhered to the adhesive layer 241. The bond pads 242 are used to deliver and receive electrical signals.

Figure 15:
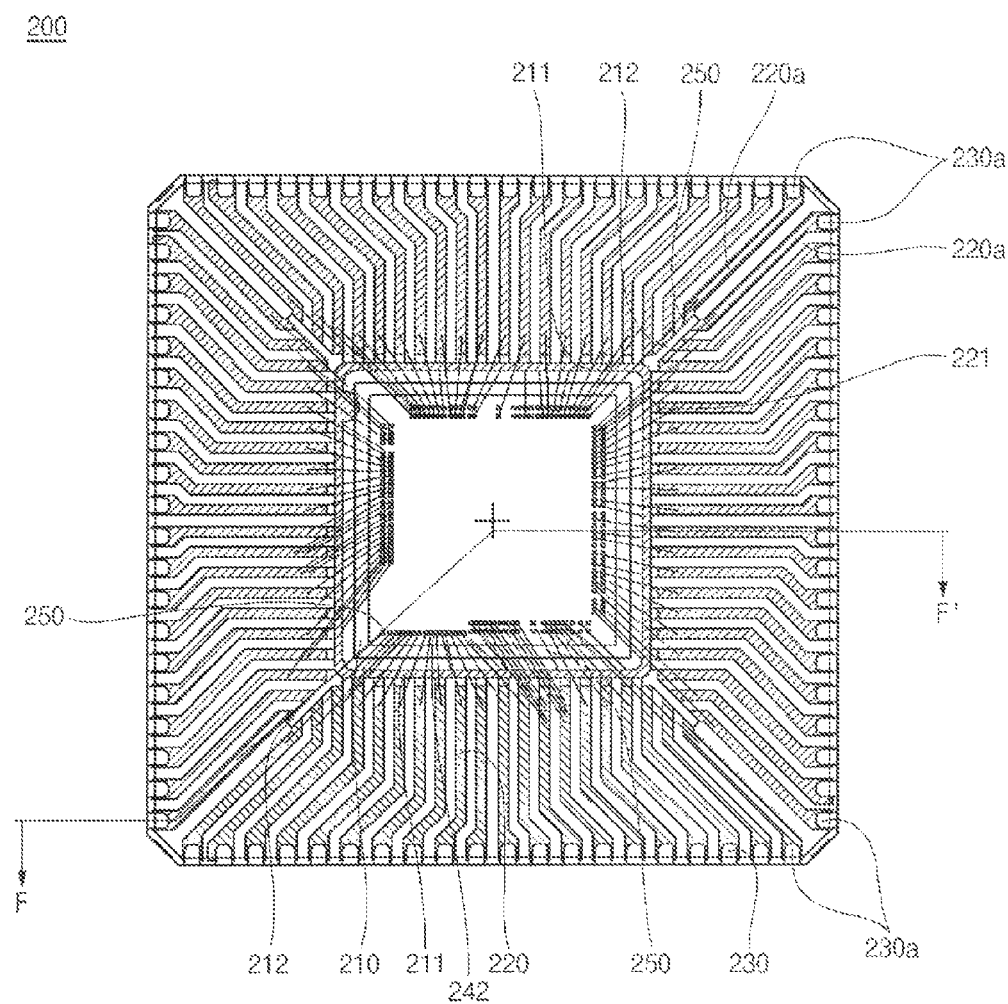
FIG. 15 is a top plan view of the semiconductor device of the second embodiment similar to FIG. 13, but with the package body partially removed so as to depict the internal features thereof.
Figure 16:
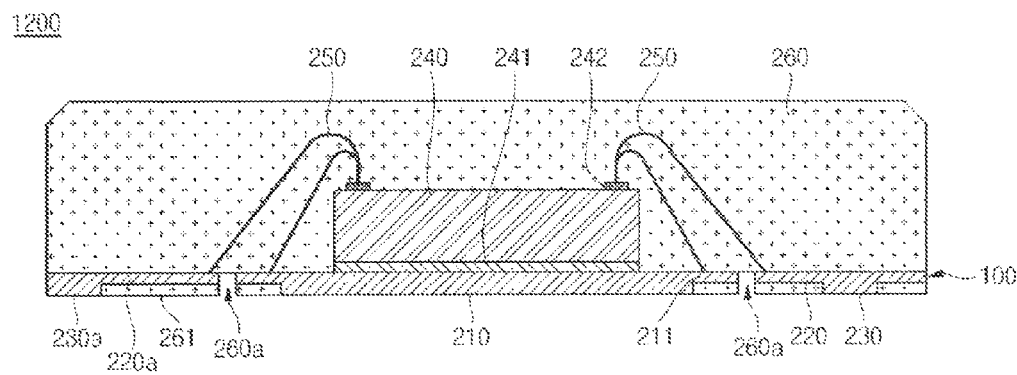
FIG. 16 is a cross-sectional view of the semiconductor device of the second embodiment taken along line F-F' of FIG. 15.

The semiconductor device 1200 further comprises a plurality of conductive wires 250 which are used to electrically connect the bond pads 242 of the semiconductor die 240 to respective ones of the connect and corner connect bars 220, 220a, and hence the lands and corner lands 230, 230a. More particularly, as seen in FIG. 15, the wires 250 are extended to the top surfaces of respective ones of the connect and corner connect bars 220, 220a. The conductive wires 250 may be fabricated from aluminum, copper, gold, silver, or a functional equivalent. However, those of ordinary skill in the art will recognize that the present invention is not limited to any particular material for the wires 250. One or more conductive wires 250 may also be used to electrically connect one or more bond pads 242 of the semiconductor die 240 directly to the die pad 210.

In the semiconductor device 1200, the die pad 210, the connect and corner connect bars 220, 220a, the extension bars 212, the semiconductor die 240 and the conductive wires 250 are at least partially encapsulated or covered by an encapsulant material which, upon hardening, forms the package body 260 of the semiconductor device 1200. More particularly, the package body 260 covers the entirety of the die pad 210 (including the etched surface 211) except for the bottom surface thereof which is circumvented by the etched surface 211. The package body 260 also covers the top and etched surfaces of the connect and corner connect bars 121, 122, 120a, as well as portions of the side surfaces thereof. The package body 260 furthers covers the top and side surfaces of the extension bars 212. However, the package body 260 does not cover those surfaces of the connect and corner connect bars 220, 220a, which define the lands and corner lands 230, 230a. As such, in the completed semiconductor device 1200, the bottom surface of the die pad 210, and the lands and corner lands 230, 230a are exposed in and substantially flush with a generally planar bottom surface 261 defined by the package body 160. During the process of fabricating the semiconductor device 1200, the dambar, portions of the connectors 221 of the connect bars 220 and portions of the extension bars 212 are also not covered by the package body 260 so that they may be removed from the leadframe 200.

Figure 14:
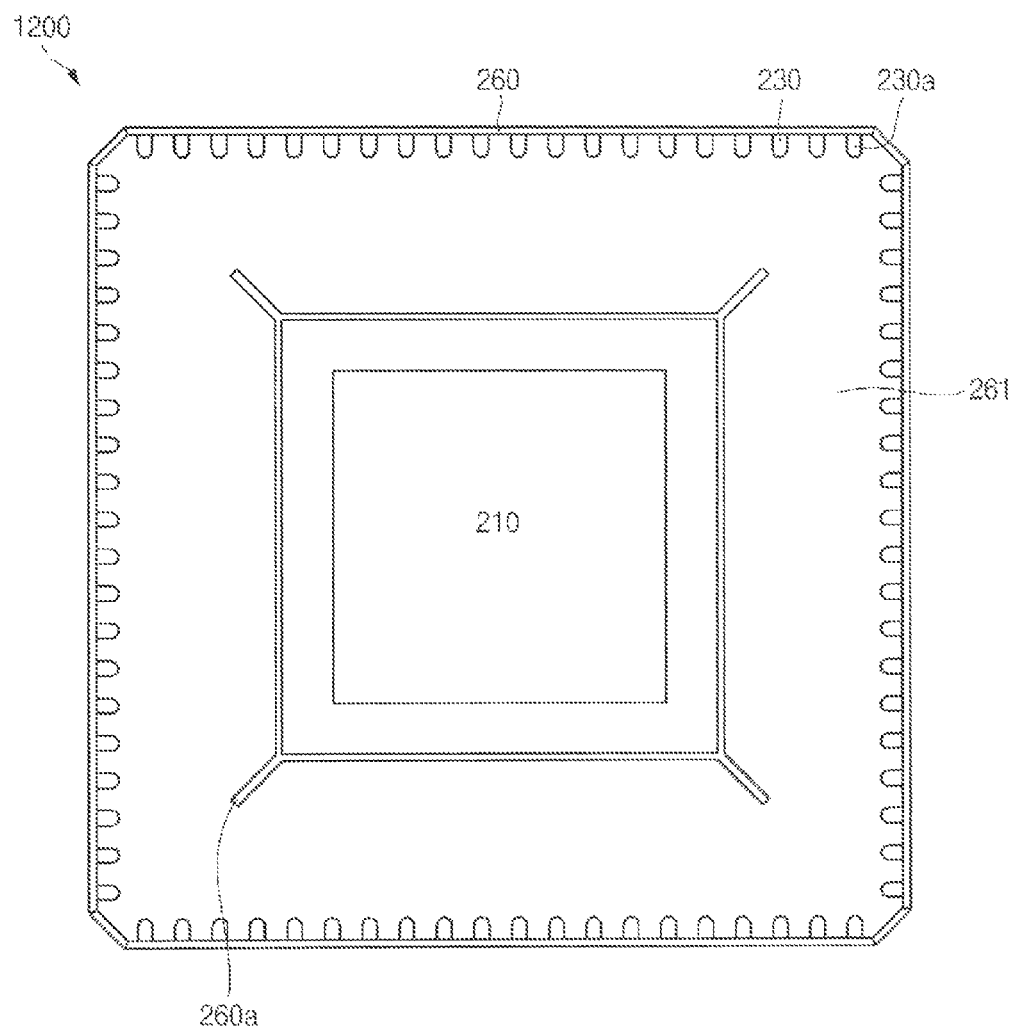
FIG. 14 is a bottom plan view of the semiconductor device of the second embodiment as fabricated to include the leadframe shown in FIGS. 5-8.

The process for fabricating the semiconductor device 1200 is substantially similar to the process described above in relation to the fabrication of the semiconductor device 1100. However, in the fabrication process for the semiconductor device 1200, the removal of the connectors 221 and the extension bars 212 is facilitated by the completion of an etching process. More particularly, it is contemplated that a photoresist may be applied to the bottom surface 261 of the package body 260, and in particular on to the exposed bottom surface of the die pad 210 and to the lands and corner lands 230, 230a. The photoresist is then patterned so as to facilitate the necessary exposure of those portions of the connectors 221 and extension bars 212 which are exposed in the bottom surface 261 of the package body 260. A wet etching process is then performed as facilitates the removal of the connectors 221 and extension bars 212, and thus the separation of the connect and corner connect bars 220, 220a from the die pad 210. As previously explained, during the process of forming the leadframe 200, the notches 221a may be etched into respective ones of the connectors 221 as effectively reduces the thickness thereof and simplifies the process of removing the same by the application of a suitable etchant thereto. As seen in FIG. 14, a trench or recess 260a may be formed in the bottom surface 261 of the package body 260 as an artifact of the etching process used to facilitate the removal of the connectors 221 and extension bars 212.

In the last step of the fabrication process for the semiconductor device 1200, the outer frame or dambar is trimmed or removed by cutting with a cutting tool so that the connect and corner connect bars 220, 220a, and hence the lands and corner lands 230, 230a, are electrically isolated from each other and from the die pad 210. It is contemplated that the dambar will be positioned outside of the package body 260 to allow for the removal thereof from the leadframe 200, and is removed by cutting the same with a dambar cutting tool. It is contemplated that the removal of the dambar may also result in distal, outer ends of the connect and corner connect bars 220, 220a being exposed in and substantially flush with a peripheral outer surface of the package body 260.

In the semiconductor device 1200, the structural attributes of the leadframe 200 allow the lengths of the conductive wires 250 extending between the bond pads 242 of the semiconductor die 240 and the connect and corner connect bars 220, 220a to be minimized, thereby reducing the complexity of and fabricating costs related to the semiconductor device 1200. Further, the leadframe 200 is uniquely configured so that conventional tie bars which would otherwise extend diagonally from each of the four corners of the die pad 210 to the dambar are replaced with each set of the corner connect bars 220a. The inclusion of the corner connect bars 220a, and hence the corner lands 230a defined thereby, effectively increases the number of input/output terminals in the semiconductor device 1200, with the structural attributes of the corner connect bars 220a allowing for the lengths of the conductive wires 250 extending thereto to be decreased or minimized, thereby reducing the complexity of and fabricating costs related to the semiconductor device 1200 as indicated above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
a generally planar die pad having multiple peripheral edge segments each defining a peripheral edge region, wherein each pair of peripheral edge regions is separated by a corner region, wherein at least one corner region is devoid of a tie bar;
a plurality of first lands that are segregated into at least two sets that extend along respective ones of at least two peripheral edge segments of the die pad in spaced relation thereto;
a plurality of second lands that are segregated into at least two sets that extend along respective ones of at least two peripheral edge segments of the die pad in spaced relation thereto;
a plurality of corner connect bars that are segregated into at least two pairs, each pair extending generally diagonally and substantially within respective ones of the corner regions in spaced and generally parallel side by side relation to each other, each of the corner connect bars defining at least one corner land;

a semiconductor die attached to the die pad and electrically connected to the first and second lands and the corner lands of the corner connect bars; and a package body defining a generally planar bottom surface, the package body at least partially encapsulating the first and second lands, the corner connect bars, and the semiconductor die such that at least portions of the first and second lands and the corner lands of the corner connect bars are exposed in and substantially flush with the bottom surface of the package body.

2. The semiconductor device of claim 1, wherein a portion of the die pad is exposed in and substantially flush with the bottom surface of the package body.

3. The semiconductor device of claim 1, wherein the die pad has a generally quadrangular configuration, and the first lands, the second lands and the corner lands are each segregated into at least four sets that each extends along a respective one of the peripheral edge segments of the die pad.

4. The semiconductor device of claim 3, wherein:
each corner region of the die pad is devoid of a tie bar;
the corner connect bars are segregated into four pairs;
the corner connect bars of each pair extend generally diagonally and entirely within a respective one of the corner regions in spaced and generally parallel side by side relation to each other; and
the corner land defined by each of the corner connect bars of each set is generally aligned with second lands of a corresponding set thereof.

5. The semiconductor device of claim 4, wherein the first lands are generally concentrically positioned between the second lands and the die pad such that each set of the first lands extends along a corresponding set of the second lands.

6. The semiconductor device of claim 5, wherein the first lands of each set thereof are offset relative to the second lands of the corresponding set thereof.

7. The semiconductor device of claim 1, wherein the first lands are separated from the die pad by at least one trench formed in the bottom surface of the package body.

8. The semiconductor device of claim 7, wherein the trench separating the first lands from the die pad is continuous.

9. The semiconductor device of claim 1, wherein the semiconductor die is electrically connected to the first and second lands and the corner land by conductive wires that are covered by the package body.

10. A semiconductor device, comprising:
a generally planar die pad multiple peripheral edge segments each defining a peripheral edge region, wherein each pair of peripheral edge regions defines a corner region, and wherein at least one corner region is absent a tie bar,
a plurality of lands that are segregated into at least two sets that extend along respective ones of at least two peripheral edge segments of the die pad in spaced relation thereto;
a plurality of corner connect bars that extend generally diagonally and substantially within respective ones of the corner regions in spaced and generally parallel side by side relation to each other, each of the corner connect bars defining at least one corner land;
a semiconductor die attached to the die pad and electrically connected to the lands and the corner lands of the corner connect bars; and
a package body defining a generally planar bottom surface, the package body at least partially encapsulating the lands, the corner connect bars, and the semiconductor die such that at least portions of the lands and the corner lands of the corner connect bars are exposed in and substantially flush with the bottom surface of the package body.

11. The semiconductor device of claim 10, wherein a portion of the die pad is exposed in and substantially flush with the bottom surface of the package body.

12. The semiconductor device of claim 10, wherein the die pad has a generally quadrangular configuration and the lands and the corner lands are segregated into at least four sets which each extends along a respective one of the peripheral edge segments of the die pad.

13. The semiconductor device of claim 12, wherein:
each corner of the die pad is absent a tie bar,
the corner connect bars are segregated into four pairs;
each pair of corner connect bars having portions that extend generally diagonally and entirely within a respective one of the corner regions in spaced and generally parallel side by side relation to each other; and
the corner land defined by each of the corner connect bars of each set is generally aligned with at least some of the lands of a corresponding set thereof.

14. The semiconductor device of claim 10, wherein the lands are separated from the die pad by a continuous trench that is formed in the bottom surface of the package body.

15. The semiconductor device of claim 10, wherein the semiconductor die is electrically connected to the lands and the corner land of the corner connect bars by conductive wires that are covered by the package body.

16. A semiconductor device, comprising:
a generally planar die pad having multiple peripheral edge segments each defining a peripheral edge region, wherein each pair of peripheral edge regions defines a corner region, wherein each corner region is devoid of a tie bar,
a plurality of connect bars that extend from respective ones of the peripheral edge segments of the die pad in spaced relation thereto, each of the connect bars defining at least one land;
a pair of corner connect bars extending generally diagonally and substantially within a respective corner region and having portions in spaced generally parallel side by side relation to each other, each of the corner connect bars defining at least one corner land;
a semiconductor die attached to the die pad and electrically connected to the lands and the corner lands of the corner connect bars; and
a package body defining a generally planar bottom surface, the package body at least partially encapsulating the connect bars, the corner connect bars, and the semiconductor die such that at least portions of the lands and the corner lands of the connect bars and the corner connect bars are exposed in and substantially flush with the bottom surface of the package body.

17. The semiconductor device of claim 16, wherein a portion of the die pad is exposed in and substantially flush with the bottom surface of the package body.

18. The semiconductor device of claim 16, wherein the die pad has a generally quadrangular configuration and the lands and the corner lands are segregated into at least four sets that each extends along a respective one of the peripheral edge segments of the die pad.

19. The semiconductor device of claim 18, wherein:
the pair of corner connect bars is entirely within the respective corner region; and
the corner land defined by each of the corner connect bars is generally aligned with at least some of the lands of a corresponding set thereof.

20. The semiconductor device of claim 16, wherein the semiconductor die is electrically connected to the lands and the corner land of the connect bars and the corner connect bars by conductive wires that are covered by the package body.

* * * * *